(12) United States Patent
Yang

(10) Patent No.: US 8,193,527 B2
(45) Date of Patent: Jun. 5, 2012

(54) ORGANIC THIN FILM TRANSISTOR AND FLAT PANEL DISPLAY DEVICE INCLUDING THE SAME

(75) Inventor: Nam-Choul Yang, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 207 days.

(21) Appl. No.: 12/700,649

(22) Filed: Feb. 4, 2010

(65) Prior Publication Data

US 2010/0133526 A1    Jun. 3, 2010

Related U.S. Application Data

(62) Division of application No. 11/361,481, filed on Feb. 24, 2006, now Pat. No. 7,683,366.

(30) Foreign Application Priority Data

Mar. 8, 2005 (KR) .......................... 10-2005-0019057

(51) Int. Cl.
*H01L 35/24* (2006.01)
(52) U.S. Cl. ................................. 257/40; 257/E51.001
(58) Field of Classification Search .................... 257/40, 257/E51.001
See application file for complete search history.

(56) References Cited

U.S. PATENT DOCUMENTS

| | | | |
|---|---|---|---|
| 5,500,537 A | 3/1996 | Tsamura et al. | |
| 6,278,127 B1 | 8/2001 | Dodabalapur et al. | |
| 6,433,359 B1 | 8/2002 | Kelley et al. | |
| 6,734,038 B2 | 5/2004 | Shtein et al. | |
| 6,852,555 B1 | 2/2005 | Roman et al. | |
| 7,019,328 B2 | 3/2006 | Chabinyc et al. | |
| 7,208,756 B2 | 4/2007 | Shih et al. | |
| 7,285,440 B2 | 10/2007 | Dimitrakopoulos et al. | |
| 7,307,277 B2 | 12/2007 | Frey et al. | |
| 7,372,070 B2 | 5/2008 | Yatsunami et al. | |
| 2003/0213952 A1 | 11/2003 | Iechi et al. | |
| 2004/0012017 A1 | 1/2004 | Nagayama | |
| 2004/0161873 A1 | 8/2004 | Dimitrakopoulos et al. | |
| 2005/0167703 A1 | 8/2005 | Klauk et al. | |
| 2005/0242342 A1 | 11/2005 | Suh et al. | |
| 2006/0043881 A1 | 3/2006 | Chin et al. | |
| 2006/0081840 A1 | 4/2006 | Mori et al. | |

(Continued)

FOREIGN PATENT DOCUMENTS

| | | |
|---|---|---|
| CN | 1476111 A | 2/2004 |
| JP | 63014472 A | 1/1988 |

(Continued)

OTHER PUBLICATIONS

Office Action issued by Japanese Patent Office on May 7, 2009 in 2 pgs.

*Primary Examiner* — Anthony Ho
(74) *Attorney, Agent, or Firm* — Knobbe Martens Olson & Bear LLP

(57) ABSTRACT

Provided are an organic thin film transistor providing smoother movement of holes between a source electrode or a drain electrode and a p-type organic semiconductor layer, and a flat panel display device including the organic thin film transistor. The organic thin film transistor includes a substrate, a gate electrode disposed on the substrate, a p-type organic semiconductor layer insulated from the gate electrode, a source electrode and a drain electrode separated from each other and insulated from the gate electrode, and a hole injection layer interposed between the source and drain electrodes and the p-type organic semiconductor layer.

16 Claims, 2 Drawing Sheets

U.S. PATENT DOCUMENTS

2006/0108581 A1 5/2006 Ahn et al.
2006/0124924 A1 6/2006 Suh et al.

FOREIGN PATENT DOCUMENTS

| | | |
|---|---|---|
| JP | 10-125924 | 5/1998 |
| JP | 2003298056 A | 1/2003 |
| JP | 2004-103905 | 2/2004 |
| JP | 2004-152958 | 5/2004 |
| JP | 2004161873 A | 6/2004 |
| WO | WO 02-01653 | 1/2002 |
| WO | WO 2004-062324 | 7/2004 |
| WO | WO 2006-040548 | 4/2006 |

ORGANIC THIN FILM TRANSISTOR AND FLAT PANEL DISPLAY DEVICE INCLUDING THE SAME

CROSS-REFERENCE TO RELATED APPLICATION

This application is a divisional of U.S. patent application Ser. No. 11/361,481, filed on Feb. 24, 2006, which claims the benefit of Korean Patent Application No. 10-2005-0019057, filed on Mar. 8, 2005, in the Korean Intellectual Property Office, the disclosure of which is incorporated herein in its entirety by reference.

BACKGROUND OF THE INVENTION

1. Field of the Invention

The present embodiments relate to an organic thin film transistor and a flat panel display including the same. More particularly, the present embodiments relate to an organic thin film transistor, providing smoother movement of holes between a source electrode or a drain electrode and a p-type organic semiconductor layer, and a flat panel display device including the organic thin film transistor.

2. Description of the Related Art

After the development of polyacetylene, which is a conjugate organic polymer representing semiconductor characteristics, research into a transistor using an organic material is being pursued in various fields, such as, functional electronic devices and optical devices, because of the characteristics of an organic material and because the organic material can be synthesized in various ways and easily formed into a fiber or a film and other advantages of the organic material, which are elasticity, conductivity, and low production costs.

Conventional silicon thin film transistors include a semiconductor layer that has a source region and a drain region each doped with impurities at a high concentration and a channel region formed between the source and drain regions. The conventional silicon thin film transistors further include a gate electrode insulated from the semiconductor layer and facing the channel region and a source electrode and a drain electrode contacting the source and drain regions, respectively.

However, since the conventional silicon thin film transistors having the above-described structure are costly, breakable by sudden impacts from external forces, and are produced at a high temperature, for example, at about 300° C. or higher, the transistors cannot be placed on a plastic substrate or the like.

In particular, flat panel display devices, such as, liquid crystal display device (LCDs) or electroluminescence display devices (ELDs), use a thin film transistor to serve as a switching device and a pixel-driving device. Furthermore, attempts to use a substrate formed not of glass but of plastic have continued to facilitate a recent trend toward large, thin, and flexible flat panel display devices. However, when a plastic substrate is used, conventional silicon thin film transistors should be produced at a low temperature instead of a high temperature. Consequently, alternatives to conventional silicon thin film transistors are needed.

This problem can be solved by using an organic film as a semiconductor layer of a thin film transistor.

However, the organic thin film transistor has a disadvantage in that a contact resistance among a source electrode, a drain electrode, and an organic semiconductor layer is large. In other words, in contrast with the silicon semiconductor layer included in the conventional silicon thin film transistor, the organic semiconductor layer included in the organic thin film transistor cannot be doped with impurities at high concentration. Accordingly, the contact resistance among a source electrode, a drain electrode, and an organic semiconductor layer increases, to the point that an ohmic contact is impossible.

SUMMARY OF THE INVENTION

The present embodiments provide an organic thin film transistor providing smoother movement of holes between a source electrode or a drain electrode and a p-type organic semiconductor layer, and a flat panel display device including the organic thin film transistor.

According to an aspect of the present embodiments, there is provided an organic thin film transistor comprising a substrate, a gate electrode disposed on the substrate, a p-type organic semiconductor layer insulated from the gate electrode, a source electrode and a drain electrode separated from each other and insulated from the gate electrode, and a hole injection layer interposed between the source and drain electrodes and the p-type organic semiconductor layer.

The p-type organic semiconductor layer may be a hole transport layer.

The p-type organic semiconductor layer may be disposed over the source electrode and the drain electrode. The gate electrode may be disposed over the p-type organic semiconductor layer. A gate insulation film may be further disposed between the p-type organic semiconductor layer and the gate electrode.

The hole injection layer may be disposed on the entire surface of the substrate to cover the source and drain electrodes.

The p-type organic semiconductor layer may be disposed over the gate electrode. The source electrode and the drain electrode may be disposed over the p-type organic semiconductor layer. A gate insulation film may be further disposed between the p-type organic semiconductor layer and the gate electrode.

The hole injection layer may be disposed to cover the p-type organic semiconductor layer.

A highest occupied molecular orbit (HOMO) level of the hole injection layer may exist in between a Fermi level of the source electrode or drain electrode and a HOMO level of the p-type organic semiconductor layer.

A hole mobility of the p-type organic semiconductor layer may be greater than a hole mobility of the hole injection layer.

A thickness of the hole injection layer may be about 10 nm to about 100 nm.

The hole injection layer may be formed of at least one compound selected from the group consisting of a triarylamine-based compound, a diarylamine-based compound, an arylamine-based compound, and a phthalocyan-based compound containing a metal ion.

The p-type organic semiconductor layer may be formed of at least one material selected from the group consisting of pentacene, polythienylenevinylene, poly-3-hexylthiophene, α-hexathienylene, tetracene, antharacene, naphthalene, α-6-thiophene, α-4-thiophene, perylene, rubrene, coronene, polythiophene, polyparaphenylenevinylene, polyparaphenylene, polyfluorene, polythiophene vinylene, polythiophene-heterocyclic aromatic copolymer, and derivatives of these materials.

A thickness of a channel region to be formed in the p-type organic semiconductor layer may be from about 50 nm to about 200 nm.

According to another aspect of the present embodiments, there is provided a flat panel display device comprising the organic thin film transistor.

According to another aspect, there is provided a flat panel display device comprising one or more organic thin film transistors, each comprising a substrate; a gate electrode disposed on the substrate; a p-type organic semiconductor layer insulated from the gate electrode; a source electrode and a drain electrode separated from each other and insulated from the gate electrode; and a hole injection layer interposed between the source and drain electrodes and the p-type organic semiconductor layer.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

The present embodiments will now be described more fully with reference to the accompanying drawings, in which exemplary embodiments are shown.

Figure 1:
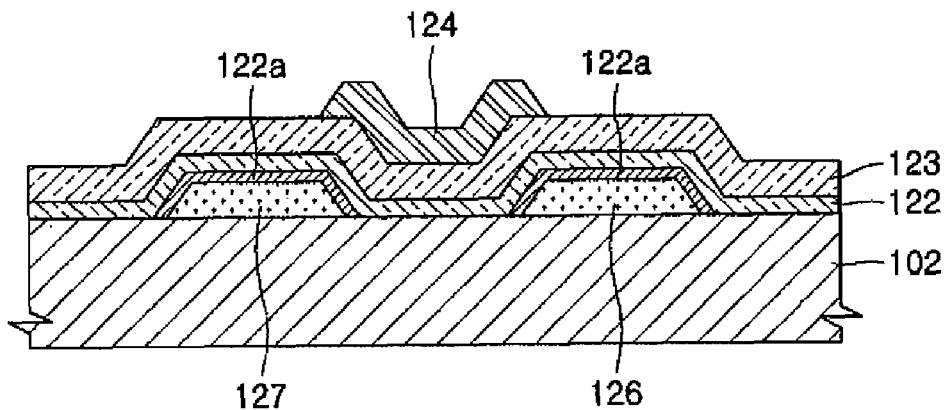
FIG. 1 is a schematic cross-sectional view of an organic thin film transistor according to an exemplary embodiment.

Referring to FIG. 1, an organic thin film transistor according to an exemplary embodiment includes a gate electrode 124, a p-type organic semiconductor layer 122 insulated from the gate electrode 124, a source electrode 126 and a drain electrode 127 separated from each other on a substrate 102 and insulated from the gate electrode 124, and a hole injection layer 122a interposed between the pair of the source electrode 126 and drain electrode 127 and the p-type organic semiconductor layer 122.

In particular, since the organic thin film transistor of FIG. 1 is a staggered type transistor, as shown in FIG. 1, the p-type organic semiconductor layer 122 is disposed over the source electrode 126 and the drain electrode 127, and the gate electrode 124 is disposed over the p-type organic semiconductor layer 122. The organic thin film transistor of FIG. 1 further includes a gate insulation film 123 disposed between the p-type organic semiconductor layer 122 and the gate electrode 124.

In the organic thin film transistor of FIG. 1, carriers in the p-type organic semiconductor layer 122 are holes. The holes should be easily transferred from one of the source electrode 126 and the drain electrode 127 to the p-type organic semiconductor layer 122. In the source electrode 126 or the drain electrode 127, the holes move along a Fermi level in an energy band diagram. In the p-type organic semiconductor layer 122, the holes move along a highest occupied molecular orbit (HOMO) level in the energy band diagram. The greater the difference between the Fermi level and the HOMO level is, the greater an energy difference, that is, a potential barrier, is. Thus, the holes cannot easily move. In other words, as the potential barrier becomes bigger, the contact resistance between a pair of source and drain electrodes and an organic semiconductor layer increases.

To solve this problem, the organic thin film transistor of FIG. 1 includes the hole injection layer 122a, which is interposed between the pair of the source electrode 126 and drain electrode 127 and the p-type organic semiconductor layer 122. The hole injection layer 122a facilitates movement of the holes from the source electrode 126 or the drain electrode 127 to the p-type organic semiconductor layer 122. When the hole injection layer 122a is interposed between the pair of the source electrode 126 and drain electrode 127 and the p-type organic semiconductor layer 122, the contact resistance can be sharply reduced compared with when the source electrode 126 or the drain electrode 127 directly contacts the p-type organic semiconductor layer 122.

To sharply reduce the contact resistance, a HOMO level of the hole injection layer 122a preferably exists between the Fermi level of the source electrode 126 or the drain electrode 127 and the HOMO level of the p-type organic semiconductor layer 122. In other words, without a change in the difference between the Fermi level of the source electrode 126 or the drain electrode 127 and the HOMO level of the p-type organic semiconductor layer 122, the hole injection layer 122a having the HOMO level existing between the Fermi level of the source electrode 126 or the drain electrode 127 and the HOMO level of the p-type organic semiconductor layer 122 is interposed between the pair of the source electrode 126 and drain electrode 127 and the p-type organic semiconductor layer 122. Thus, the probability that the holes move from the source or drain electrode 126 or 127 to the p-type organic semiconductor layer 122 via the hole injection layer 122a increases. This is because holes move along a Fermi level of an electrode and a HOMO level of a hole injection layer or an organic semiconductor layer. The hole injection layer 122a may be formed of at least one compound selected from the group consisting of a triarylamine-based compound, a diarylamine-based compound, an arylamine-based compound, and a phthalocyan-based compound containing a metal ion. Examples of these compounds include a copper phthalycianine (CuPc), a Starburst amine-family material (e.g., 4,4',4"-tris (N-carbazole)triphenyl amine (TCTA), 4,4',4"-tris(3-methylphenyl-phenylamino)-triphenylamine (m-MTDATA), etc.), and the like. The hole injection layer 122a may be formed by deposition.

Since holes introduced from one of the source electrode 126 and the drain electrode 127 into the p-type organic semiconductor layer 122 should be transferred to the other electrode, the p-type organic semiconductor layer 122 is preferably, but not necessarily, fabricated as a hole transport layer. The p-type organic semiconductor layer 122 is formed of at least one of pentacene, polythienylenevinylene, poly-3-hexylthiophene, α-hexathienylene, tetracene, antharacene, naphthalene, α-6-thiophene, α-4-thiophene, perylene, rubrene, coronene, polythiophene, polyparaphenylenevinylene, polyparaphenylene, polyfluorene, polythiophenevinylene, polythiophene-heterocyclic aromatic copolymer, and derivatives of these materials.

Since a hole-moving channel between the source electrode 126 and the drain electrode 127 is formed in the p-type organic semiconductor layer 122, the hole mobility of the p-type organic semiconductor layer 122 is preferably greater than the hole mobility of the hole injection layer 122a.

The above-described characteristics of the hole injection layer 122a and the p-type organic semiconductor layer 122 are applied equally to the modifications or embodiments to be described below.

Figure 2:
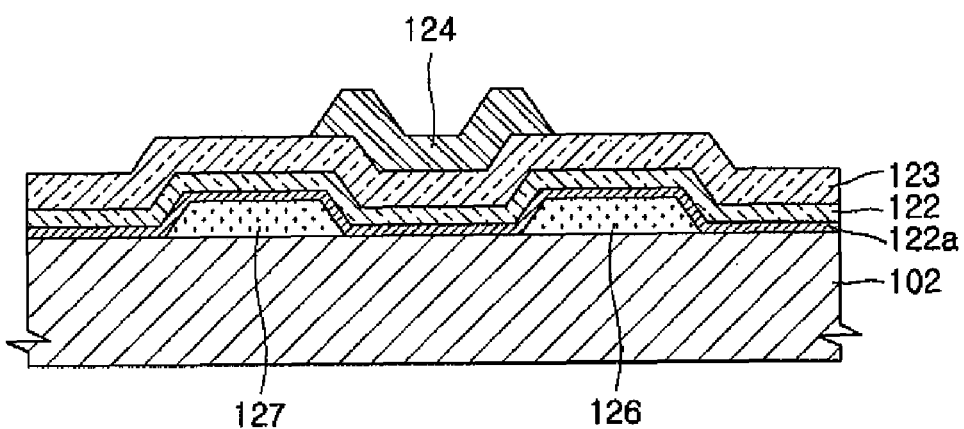
FIG. 2 is a schematic cross-sectional view of a modification of the organic thin film transistor of FIG. 1.

FIG. 2 is a schematic cross-sectional view of a modification of the organic thin film transistor of FIG. 1. Although the hole injection layer 122a in the organic thin film transistor of FIG. 1 covers only the source electrode 126 and the drain electrode 127, the hole injection layer 122a in the organic thin film transistor of FIG. 2 covers not only the source electrode 126 and the drain electrode 127 but also exposed areas of the substrate 102.

The hole injection layer 122a in the organic thin film transistor of FIG. 1 can be formed by depositing an organic material using a mask to cover only the source electrode 126 and the drain electrode 127, by forming a hole injection layer on the entire surface of the substrate 102 and patterning the hole injection layer, by performing, for example, Inkjet printing, or by using other techniques. However, such processes of forming the hole injection layer 122a are complicated. Hence, in the organic thin film transistor of FIG. 2, the hole injection layer 122a is formed on the entire surface of the substrate 102 to cover the source electrode 126 and the drain electrode 127, thereby simplifying the formation of the hole injection layer 122a. The hole injection layer 122a of FIG. 2 may be formed by blanket deposition or spin coating.

Since a hole-moving channel between the source electrode 126 and the drain electrode 127 is formed in the p-type organic semiconductor layer 122, a thickness of the hole injection layer 122a is preferably, but not necessarily, between about 10 nm and about 100 nm. When the thickness of the hole injection layer 122a exceeds 100 nm, the hole-moving channel formed in the p-type organic semiconductor layer 122 may not be connected to the source electrode 126 or the drain electrode 127. When the thickness of the hole injection layer 122a is less than 10 nm, the hole-moving channel formed in the p-type organic semiconductor layer 122 may not properly function as a hole injection layer. When the thickness of the hole injection layer 122a is between about 10 nm to about 100 nm, a thickness of the channel formed in the p-type organic semiconductor layer 122 is preferably, but not necessarily, between about 50 nm and about 200 nm.

Although the organic thin film transistors of FIGS. 1 and 2 are staggered type transistors, the present embodiments are not limited to staggered type transistors.

Figure 3:
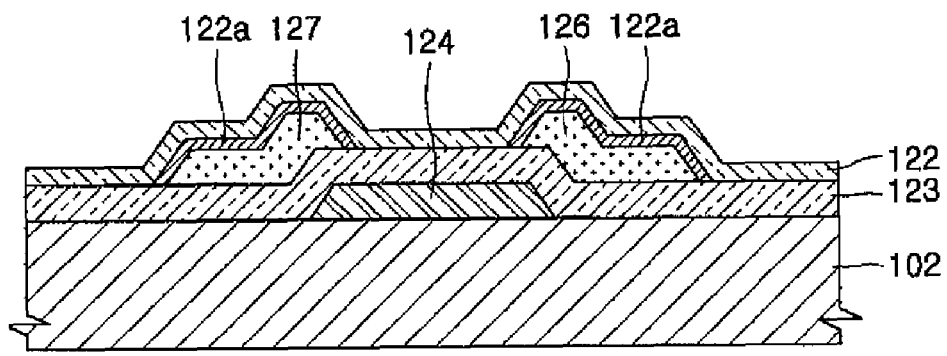
FIG. 3 is a schematic cross-sectional view of an organic thin film transistor according to another exemplary embodiment.

In other words, the present embodiments may be applied, for example, to an inverted coplanar type organic thin film transistor as shown in FIG. 3, in which a source electrode 126 and a drain electrode 127 are disposed over a gate electrode 124, a p-type organic semiconductor layer 122 is disposed over the source electrode 126 and the drain electrode 127, and a gate insulation film 123 is further included between a pair of the source and drain electrodes 126 and 127 and the gate electrode 124. In this case, a hole injection layer 122a is formed on only the source electrode 126 and the drain electrode 127 not on exposed areas of the gate insulation film 123. The gate insulation film 123 and the gate electrode 124 are formed on the substrate 102.

Figure 4:
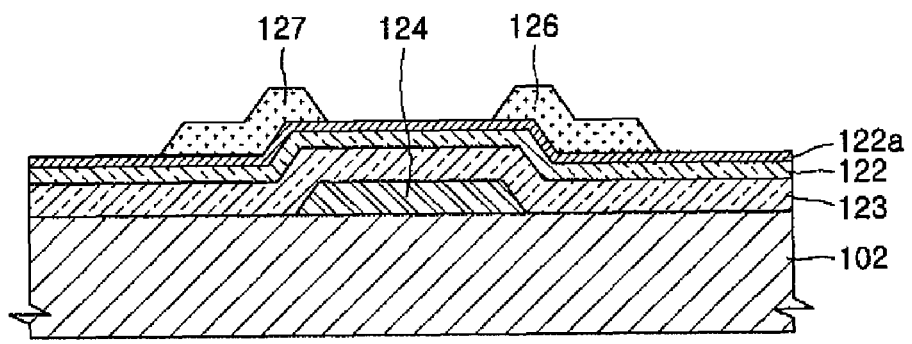
FIG. 4 is a schematic cross-sectional view of an organic thin film transistor according to another exemplary embodiment.

The present embodiments may also be applied to an inverted staggered type organic thin film transistor as shown in FIG. 4, in which a p-type organic semiconductor layer 122 is disposed over a gate electrode 124, a source electrode 126 and a drain electrode 127 are disposed over the p-type organic semiconductor layer 122, and a gate insulation film 123 is further included between the p-type organic semiconductor layer 122 and the gate electrode 124. The gate insulation film 123 and the gate electrode 124 are formed on the substrate 102. In this case, a hole injection layer 122a is formed on the entire surface of the p-type organic semiconductor layer 122. Of course, various changes to the hole injection layer 122a may be made. For example, the hole injection layer 122a may be formed in only spaces between the source electrode 126 and the p-type organic semiconductor layer 122 and between the drain electrode 127 and the p-type organic semiconductor layer 122.

Of course, the present embodiments may be applied to various embodiments other than the organic thin film transistors according to the above-described embodiments.

Figure 5:
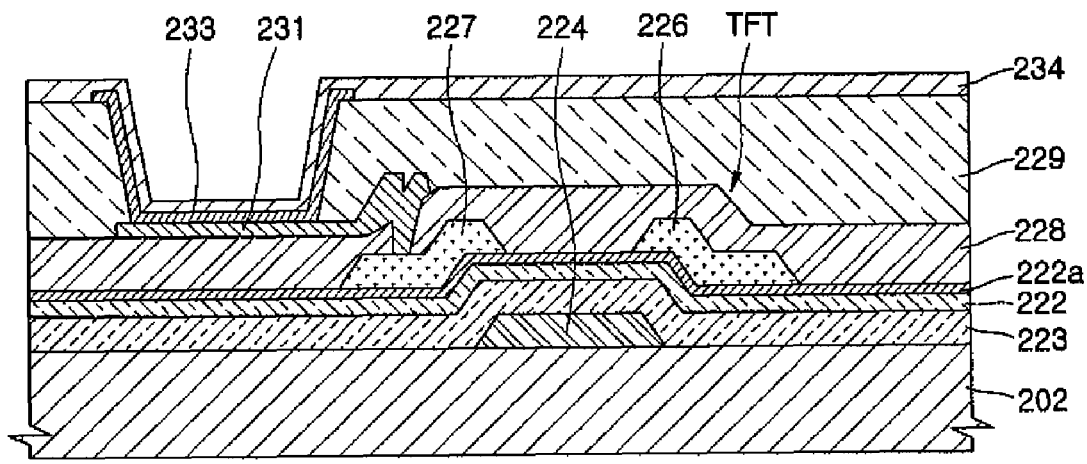
FIG. 5 is a schematic cross-sectional view of an electroluminescence display device according to an exemplary embodiment.

FIG. 5 is a schematic cross-sectional view of an electroluminescence display device (ELD) according to an exemplary embodiment. Since the above-described organic thin film transistors are flexible, they can be used in various flexible flat panel display devices that include thin film transistors. Various display devices, such as, LCDs, organic ELDs, etc., exist as such flat panel display devices, so an organic ELD including an organic thin film transistor as described above will now be described in brief. FIG. 5 uses the TFT shown in FIG. 4. As such, 223 is the gate insulation film, 224 is the gate electrode, 222 is the p-type organic semiconductor layer, 222a is the hole injection layer, 226 is the source electrode, 227 is the drain electrode and 202 is the substrate.

In an ELD that includes organic thin film transistors according to one of the above-described embodiments, electroluminescence elements and the organic thin film transistors are installed on a substrate 202, which may be formed of transparent glass. The substrate 202 may also be formed of, for example, acrylics, polyimide, polycarbonate, polyester, mylar, or other plastic materials.

Although various types of ELDs may be used, the ELD of FIG. 5 is an active matrix (AM) type ELD that includes organic thin film transistors.

Each sub-pixel of an AM type ELD includes at least one thin film transistor (TFT) as shown in FIG. 5. Referring to FIG. 5, a buffer layer (not shown) made of $SiO_2$, for example, may be formed on the substrate 202, and an organic TFT as described above is installed on the buffer layer. Although one of the organic TFTs according to the above-described embodiments and modifications thereof is illustrated in FIG. 5, the present embodiments are not limited to the illustrated organic TFT.

A passivation film 228 made of $SiO_2$, for example, is formed over the TFT. A pixel definition film 229 made of acryl, polyimide, or the like is formed on the passivation film 228. The passivation film 228 may serve as a protection film for protecting the TFT or as a planarization film for planarizing an upper surface of the TFT.

Although not shown in FIG. 5, at least one capacitor may be connected to the TFT. Of course, a circuit including the TFT is not limited to the example illustrated in FIG. 5 but may be changed into various forms.

An electroluminescence element, that is, a sub-pixel, is connected to a drain electrode 227. A first electrode 231 included in the electroluminescence element is formed on the passivation film 228, on which, in turn, the pixel definition film 229, which is insulative, is formed. An intermediate layer 233 including at least one light-emission layer is formed in an aperture formed in the pixel definition film 229. A second electrode 234 is formed on the resultant pixel definition film 229. Various changes in the second electrode 234 may be made, for example, the second electrode 234 may be commonly formed in a plurality of pixels. Although the intermediate layer 233 illustrated in FIG. 5 is formed to correspond only to the sub-pixel, this is done for convenience of explanation of a structure of each sub-pixel. Of course, the intermediate layer 233 of the sub-pixel may be combined with intermediate layers of adjacent sub-pixels into a single body. The intermediate layers 233 may be modified into various forms, for example, some of intermediate layers 233 are separately formed to correspond to respective sub-pixels, and the others are formed in a single body to commonly correspond to sub-pixels.

In one embodiment, the first electrode 231 serves as an anode, and the second electrode 234 serves as a cathode. Of course, the polarities of the first and electrode 231 may be reversed.

The first electrode 231 may be a transparent electrode or a reflective electrode. To use the first electrode 231 as the transparent electrode, the first electrode 231 may be formed of indium-tin-oxide (ITO), indium zinc oxide (IZO), ZnO, or $In_2O_3$. To use the first electrode 231 as the reflective electrode, a reflective film may be formed of Ag, Mg, Al, Pt, Pd, Au, Ni, Nd, Ir, Cr, or a compound of these materials and then coated with ITO, IZO, ZnO, or $In_2O_3$.

The second electrode 234 may also be a transparent electrode or a reflective electrode. To use the second electrode 234 as the transparent electrode, Li, Ca, LiF/Ca, LiF/Al, Al, Mg, or a compound of these materials may be head deposited for the intermediate layer 233, and then an auxiliary electrode or a bus electrode may be formed of a transparent electrode forming material, such as, ITO, IZO, ZnO, or $In_2O_3$, on the result of the deposition. To use the second electrode 234 as the reflective electrode, Li, Ca, LiF/Ca, LiF/Al, Al, Mg, or a compound of these materials may be blanket deposited.

The intermediate layer 233 interposed between the first and second electrodes 231 and 234 may be formed from an organic material or an inorganic material. Examples of the organic material include a monomer organic material and a polymer organic material. When the intermediate layer 233 is formed from a monomer organic material, it may include a single hole injection layer (HIL), a single hole transport layer (HTL), a single emission layer (EML), a single electron transport layer (ETL), or a single electron injection layer (EIL), which are stacked. Alternatively, the intermediate layer 233 may be a single layer that perform all functions of an HIL, an HTL, an EML, an ETL, an ETL, and an EIL. Examples of available monomer organic materials include: copper phthalocyanine (CuPc); N, N'-Di(naphthalene-1-yl)-N,N-diphenyl-benzidine (NPB); tris-8-hydroxyquinoline aluminum (Alq3), etc. These monomer organic materials may be formed, for example, by a vacuum deposition method using a mask.

When the intermediate layer 233 is formed of a polymer organic material, it may usually include an HTL and an EML. In this case, the HTL is formed of Poly(3,4-ethylenedioxythiophene)poly(styrenesulfonate) (PEDOT), and the EML is formed of a polymer organic material, such as, a polyphenylenevinylene-based (PPV-based) material or a polyfluorene-based material.

The electroluminescence element formed on the substrate 202 is sealed with a facing element (not shown). The facing element may be formed of glass or plastic like the substrate 202. Alternatively, the facing element may be a metal cap or the like.

The ELD of FIG. 5 includes organic thin film transistors according to one of the above-described embodiments, thereby displaying an exact image according to an input image signal.

Although an ELD has been illustrated to describe the present embodiments, the present embodiments may be applied to any display device as long as it includes organic thin film transistors.

In an organic thin film transistor according to the present embodiments, a hole injection layer is interposed between a pair of a source electrode and a drain electrode and a p-type organic semiconductor layer, so that a contact resistance between the pair of source and drain electrodes and the p-type organic semiconductor layer can decrease sharply. Thus, a flat panel display device including the organic thin film transistor can display a clear, accurate image.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic thin film transistor comprising:
   a substrate;
   a gate electrode disposed on the substrate;
   a p-type organic semiconductor layer insulated from the gate electrode;
   a source electrode and a drain electrode separated from each other and insulated from the gate electrode; and
   a hole injection layer interposed between the source and drain electrodes and the p-type organic semiconductor layer,
   wherein the p-type organic semiconductor layer is disposed over the gate electrode, the source electrode and the drain electrode are disposed over the p-type organic semiconductor layer, and a gate insulation film is further disposed between the p-type organic semiconductor layer and the gate electrode, and
   wherein the hole injection layer is disposed to cover the p-type organic semiconductor layer.

2. The organic thin film transistor of claim 1, wherein the p-type organic semiconductor layer is a hole transport layer.

3. The organic thin film transistor of claim 1, wherein a highest occupied molecular orbit level of the hole injection layer exists in between a Fermi level of the source electrode or drain electrode and a highest occupied molecular orbit level of the p-type organic semiconductor layer.

4. The organic thin film transistor of claim 1, wherein a hole mobility of the p-type organic semiconductor layer is greater than a hole mobility of the hole injection layer.

5. The organic thin film transistor of claim 1, wherein the thickness of the hole injection layer is from about 10 nm to about 100 nm.

6. The organic film transistor of claim 1, wherein the hole injection layer is formed of at least one compound selected from the group consisting of a triarylamine-based compound, a diarylamine-based compound, an arylamine-based compound, and a phthalocyan-based compound containing metal.

7. The organic thin film transistor of claim 1, wherein the p-type organic semiconductor layer is formed of at least one material selected from the group consisting of pentacene, polythienylenevinylene, poly-3-hexylthiophene, α-4-thiophene, perylene, rubrene, coronene, polythiophene, polyparaphenylenevinylene, polyparaphenylene, polyfluorene, polythiophenevinylene, polyparaphenylene, polyfluorene, polythiophenevinylene, polythiophene-heterocyclic aromatic copolymer, and derivatives of these materials.

8. The organic thin film transistor of claim 1, further comprising a channel region wherein the thickness of the channel region to be formed in the p-type organic semiconductor layer is from about 50 nm to about 200 nm.

9. A flat panel display device comprising one or more organic thin film transistors, each comprising:
   a substrate;
   a gate electrode disposed on the substrate;
   a p-type organic semiconductor layer insulated from the gate electrode;
   a source electrode and a drain electrode separated from each other and insulated from the gate electrode; and
   a hole injection layer interposed between the source and drain electrodes and the p-type organic semiconductor layer,
   wherein the p-type organic semiconductor layer is disposed over the gate electrode, the source electrode and the drain electrode are disposed over the p-type organic semiconductor layer, and a gate insulation film is further disposed between the p-type organic semiconductor layer and the gate electrode, and
   wherein the hole injection layer is disposed to cover the p-type organic semiconductor layer.

10. The flat panel display device of claim 9, wherein the p-type organic semiconductor layer is a hole transport layer.

11. The flat panel display device of claim 9, wherein a highest occupied molecular orbit level of the hole injection layer exists in between a Fermi level of the source electrode or drain electrode and a highest occupied molecular orbit level of the p-type organic semiconductor layer.

12. The flat panel display device of claim 9, wherein the hole mobility of the p-type organic semiconductor layer is greater than a hole mobility of the hole injection layer.

13. The flat panel display device of claim 9, wherein the thickness of the hole injection layer is from about 10 nm to about 100 nm.

14. The flat panel display device of claim 9, wherein the hole injection layer is formed of at least one compound selected from the group consisting of a triarylamine-based compound, a diarylamine-based compound, an arylamine-based compound, and a phthalocyan-based compound containing metal.

15. The flat panel display device of claim 9, wherein the p-type organic semiconductor layer is formed of at least one material selected from the group consisting of pentacene, polythienylenevinylene, poly-3-hexylthiophene, α-hexathienylene, tetracene, antharacene, naphthalene, α-6-thiophene, α-4-thiophene, perylene, rubrene, coronene, polythiophene, polyparaphenylenevinylene, polyparaphenylene, polyfluorene, polythiophenevinylene, polythiophene-heterocyclic aromatic copolymer, and derivatives of these materials.

16. The flat panel display device of claim 9, further comprising a channel region wherein the thickness of the channel region to be formed in the p-type organic semiconductor layer is from about 50 nm to about 200 nm.

* * * * *